(12) United States Patent
Yoshida

(10) Patent No.: US 6,525,351 B2
(45) Date of Patent: Feb. 25, 2003

(54) SOLID-STATE IMAGING DEVICE CAPABLE OF IMPROVING SENSITIVITY WITHOUT CAUSING RISE IN DEPLETION VOLTAGE AND SHUTTER VOLTAGE

(75) Inventor: Toshio Yoshida, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/819,474

(22) Filed: Mar. 28, 2001

(65) Prior Publication Data

US 2001/0042875 A1 Nov. 22, 2001

(30) Foreign Application Priority Data

Mar. 31, 2000  (JP) .......................................... 2000-097385

(51) Int. Cl.$^7$ ............................................ H01L 27/148
(52) U.S. Cl. ......................... 257/229; 257/223; 257/230
(58) Field of Search ................................ 257/223, 229, 257/230, 445, 291

(56) References Cited

U.S. PATENT DOCUMENTS 5,898,195 A  *  4/1999  Harada et al. ............... 257/223
6,188,093 B1  *  2/2002  Isogai et al. ................. 257/230
6,351,001 B1  *  2/2002  Stevens et al. .............. 257/223

FOREIGN PATENT DOCUMENTS

JP  5183184  7/1993

* cited by examiner

Primary Examiner—Richard Elms
Assistant Examiner—Bradley Smith
(74) Attorney, Agent, or Firm—David G. Conlin; William J. Daley, Jr.; Edwards & Angell, LLP

(57) ABSTRACT

A high-concentration light-receiving N-layer 32 is formed by ion implantation in a region near a substrate surface, and a low-concentration N-type epitaxial layer 25 is formed by epitaxial growth in a deeper region. The depletion layer of a photodiode is thus expanded to a deep portion of the substrate by the low-concentration N-type region 25, by which a photoelectric conversion effect on incident light of a long wavelength is increased to improve sensitivity. In the above stage, a deepest potential portion is formed on the substrate surface side. Therefore, a depletion voltage can be prevented from rising. Further, an intermediate-concentration N-type epitaxial layer 23 and a high-concentration N-type epitaxial layer 22 are formed in a stack of two layers by epitaxial growth in a region deeper than a region in which a first P-type layer 24, or a barrier region is formed, by which a shutter voltage can be prevented from rising. Thus, sensitivity is improved without causing a rise in the depletion voltage and shutter voltage.

7 Claims, 6 Drawing Sheets

SOLID-STATE IMAGING DEVICE CAPABLE OF IMPROVING SENSITIVITY WITHOUT CAUSING RISE IN DEPLETION VOLTAGE AND SHUTTER VOLTAGE

BACKGROUND OF THE INVENTION

The present invention relates to a solid-state imaging device, and in particular, to a solid-state imaging device capable of improving sensitivity without causing a rise in depletion voltage and shutter voltage.

In recent years, solid-state imaging devices are demanded to have a performance of high sensitivity throughout a wide range of wavelength. FIG. 7 shows a sectional view of a conventional solid-state imaging device (Japanese Patent Laid-Open Publication No. HEI 5-183184). This solid-state imaging device is formed as follows.

In the above-mentioned solid-state imaging device, practically a P-type epitaxial layer is formed directly on the entire surface of an N-type Si substrate 1. For the sake of comparison with the present invention, it is assumed that an N-type epitaxial layer 2 is formed on the entire surface of the N-type Si substrate 1 at an impurity concentration approximately equal to that of the N-type Si substrate 1. It is to be noted that this arrangement has neither direct relation to the present invention nor any problem since a NonNsub substrate is generally employed as an N-type substrate in the recent CCD (charge coupled device).

Next, a first P-type epitaxial layer 3 is formed on the entire surface of the N-type epitaxial layer 2 by epitaxial growth, and an N-type epitaxial layer (light-receiving N-layer) 4 is formed on the entire surface of the first P-type epitaxial layer 3. Subsequently, boron ions are implanted into regions other than a light-receiving region 7 with an energy of 500 keV to 10 MeV, forming a second P-type layer 5 that reaches the first P-type epitaxial layer 3. Subsequently, a transfer channel layer 8 that becomes a charge transfer region 6, a channel stop region 9 for the separation of individual pixels, a transfer gate region 10 for transferring electric charges from the light-receiving region 7 to the charge transfer region 6 and a P$^+$ region (light-receiving P-layer) 11 for reducing the interface state level of the surface of the light-receiving region 7 are formed by ion implantation.

A silicon oxide film 12 that serves as a gate insulator is further formed on the entire surface of the aforementioned layers. A silicon nitride film 13 that serves as a gate insulator and an N$^+$ polysilicon gate electrode 14 that serves as a transfer electrode are formed in the portions other than the light-receiving region 7. An interlayer oxide film 15 that serves as an insulator is formed on the above layers, and thereafter, a light-shielding film 16 is formed so as to cover the portions other than the light-receiving region 7. A flattening film 17 of BPSG (boro-phospho silicate glass) or the like is formed to flatten the surface, and finally an overcoat (passivation film) 18 of a silicon nitride film or the like is formed, obtaining the aforementioned solid-state imaging device.

However, the aforementioned conventional solid-state imaging device has the following problems. That is, in order to increase the sensitivity, the first P-type epitaxial layer 3, which is the barrier region between the light-receiving N-layer 4 and the N-type substrate 1, is formed in a deep region apart from the substrate surface i.e. the outside surface aiming at increasing the depth of a photoelectric conversion region in the light-receiving region 7, and the light-receiving N-layer 4 is formed by N-type epitaxial growth.

Accordingly, this solid-state imaging device has the problem that it is difficult to make contact of the N-type substrate 1 from the substrate surface. Furthermore, since the light-receiving N-layer 4 and the first P-type epitaxial layer 3 are formed by epitaxial growth, it is difficult to control the impurity concentration by comparison with the case of the formation by ion implantation. Therefore, it is difficult to control the quantity of electric charges (photodiode capacitance) that can be accumulated in the light-receiving region 7, a voltage (depletion voltage) for completely reading out the electric charges accumulated in the light-receiving region 7 to the charge transfer region 6 and a voltage (shutter voltage) for completely sweeping out the electric charges accumulated in the light-receiving region 7 toward the substrate. In other words, there is the problem that the quantity of the accumulated electric charges in the light-receiving region 7, the depletion voltage and the shutter voltage vary.

Furthermore, in order to accumulate electric charges in the light-receiving region 7, the light-receiving N-layer 4 is required to have an impurity concentration (hereinafter referred to simply as a concentration) of not lower than $1 \times 10^{15}$ cm$^{-3}$. However, the light-receiving N-layer 4 is formed by the N-type epitaxial growth method, and therefore, a high-concentration N-type epitaxial layer broadly expands to a deep portion of the substrate as indicated by a region B shown in the concentration profile of the cross section A–A' in FIG. 8. Consequently, a deep potential region broadly expands in the deep portion of the substrate as shown in the potential profile of the cross section A–A' in FIG. 9. As a result, there is the problem that the depletion voltage and the shutter voltage rise.

The light-receiving region 7 is formed of the high-concentration epitaxial layer, and therefore, a P-type channel stop region 9 is formed by high-energy implantation for the separation of individual pixels. Accordingly, there is also the problem that the depth of the light-receiving N-layer 4, or the N-type epitaxial layer is limited to a depth at which separation can be provided by the P-type channel stop region 9 formed by high energy implantation.

SUMMARY OF THE INVENTION

Accordingly, the object of the present invention is to provide a solid-state imaging device capable of improving sensitivity without causing a rise in depletion voltage and shutter voltage.

In order to achieve the aforementioned object, the present invention provides a solid-state imaging device comprising:

a first impurity layer forming part of a photodiode;

a second impurity layer being formed on entire region including a portion under the first impurity layer, being of a conductive type identical to that of the first impurity layer and having an impurity concentration lower than that of the first impurity layer;

a third impurity layer being formed under the second impurity layer and being of a conductive type different from that of the first impurity layer;

a fourth impurity layer being formed under the third impurity layer and being of a conductive type identical to that of the first impurity layer; and a fifth impurity layer being formed under the fourth impurity layer, being of a conductive type identical to that of the fourth impurity layer and having an impurity concentration higher than that of the fourth impurity layer.

According to the above-mentioned construction, the second impurity layer that is of the conductive type identical to that of the first impurity layer and has the impurity concentration lower than that of the first impurity layer is formed in the entire region including the portion under the first impurity layer that is forming part of the photodiode. With this arrangement, the high-concentration first impurity layer is formed in a region near the substrate surface, and the low-concentration second impurity layer is formed in the deeper region, so that the depletion layer formed in the photodiode is expanded to the deep portion of the substrate by the low-concentration second impurity layer. As a result, a photoelectric conversion effect on the incident light of a long wavelength is improved to increase the sensitivity. In the above case, the deepest potential portion is formed on the substrate surface side, and therefore, the depletion voltage, which is the voltage for completely reading out the electric charges accumulated in the photodiode, is prevented from rising.

Furthermore, the fourth impurity layer of the conductive type identical to that of the first impurity layer and the fifth impurity layer that is of the conductive type identical to that of the fourth impurity layer and has an impurity concentration higher than that of the fourth impurity layer are formed in a stack of two layers in a region deeper than the region in which the third impurity layer of the conductive type different from that of the first impurity layer is formed. With this arrangement, the shutter voltage, which is the voltage for sweeping the electric charges accumulated in the photodiode toward the substrate, is prevented from rising.

That is, according to the present invention, the sensitivity can be improved without causing a raise in the depletion voltage and the shutter voltage.

In one embodiment, the third impurity layer is formed excluding at least part of a non-imaging region.

According to the above embodiment, the third impurity layer of the conductive type different from that of the first impurity layer is not formed entirely or partially in the non-imaging region. Therefore, electrical contact from the first impurity layer side is made with the fifth impurity layer of the conductive type identical to that of the first impurity layer and with the lower layers via the region in which the third impurity layer is not formed.

In one embodiment, the fourth impurity layer and the fifth impurity layer are continuously formed by varying a gas flow rate in one epitaxial growth process.

According to the above embodiment, the fourth impurity layer and the fifth impurity layer are grown in one film forming process, reducing the fabricating processes.

In one embodiment, the fifth impurity layer has an impurity concentration of not lower than $5 \times 10^{15}$ cm$^{-3}$.

According to the above embodiment, the impurity concentration of the fifth impurity layer is not lower than $5 \times 10^{15}$ cm$^{-3}$. Therefore, the shutter voltage is effectively prevented from rising.

In one embodiment, the second impurity layer is formed by low pressure epitaxial growth whose growth temperature is higher than 1050° C. and lower than 1150° C.

According to the above embodiment, the second impurity layer is formed by low pressure epitaxial growth at a temperature lower than 1150° C. Therefore, the shape of an alignment target provided in the third impurity layer is maintained so as not to collapse.

In one embodiment, the second impurity layer is formed by atmospheric pressure epitaxial growth whose growth temperature is not lower than 1150° C.

According to the above embodiment, the second impurity layer is formed by atmospheric pressure epitaxial growth at a temperature of not lower than 1150° C. Therefore, the shape of the alignment target provided in the third impurity layer is maintained so as not to collapse.

In one embodiment, the second impurity layer has an impurity concentration of not higher than $1 \times 10^{14}$ cm$^{-3}$.

According to the above embodiment, it is effectively performed to expand the depletion layer formed in the photodiode to the deep portion of the substrate and to form the deepest potential portion on the substrate surface side. As a result, the sensitivity is improved without causing a rise in the depletion voltage.

In one embodiment, the first impurity layer and the second impurity layer have impurity concentrations differing from each other by two or more orders of magnitude, and the impurity concentration of the first impurity layer is set higher than the impurity concentration of the second impurity layer.

According to the above embodiment, the deepest potential portion is reliably formed on the substrate surface side. Therefore, the depletion voltage is more effectively prevented from rising.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
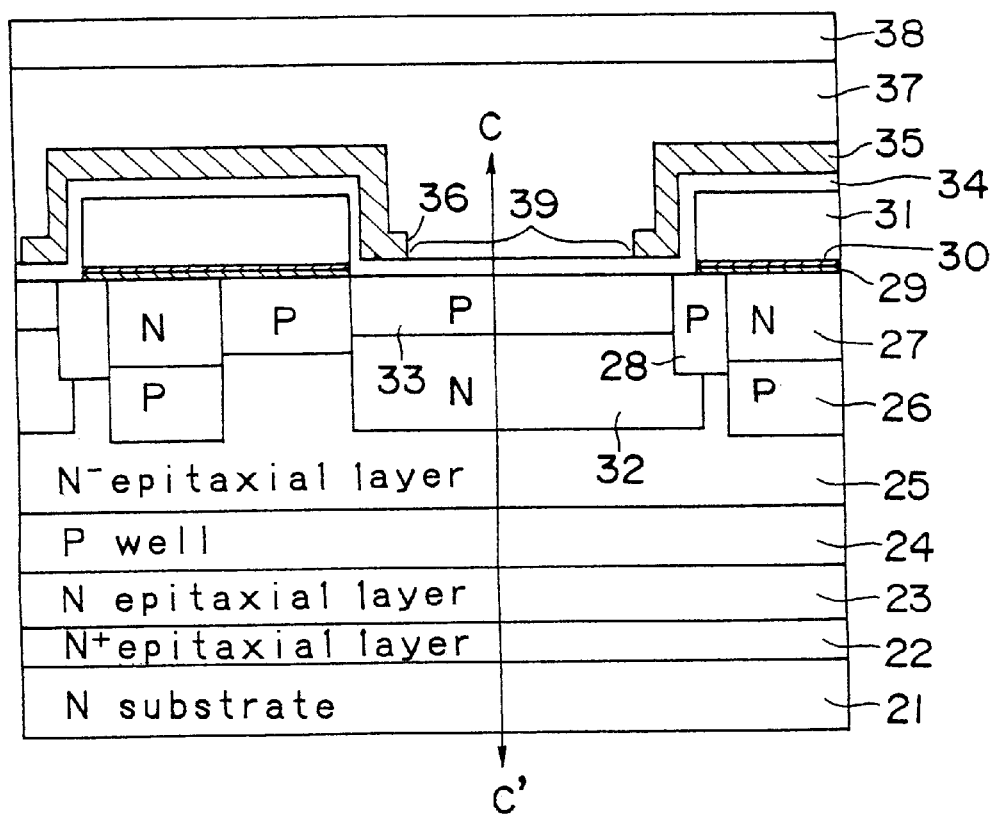
FIG. 1 is a sectional view of a solid-state imaging device of one embodiment of the present invention.

The present invention will be described in detail below on the basis of the embodiments thereof shown in the drawings. FIG. 1 is a sectional view of a solid-state imaging device according to the present embodiment. The present solid-state imaging device is formed in accordance with a procedure as shown in FIGS. 2A, 2B, 2C, 2D and 2E.

Figure 2A:
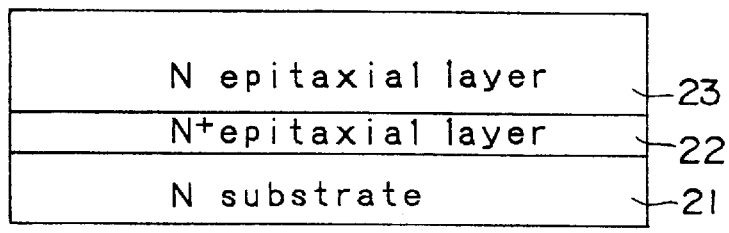
FIGS. 2A through 2E are views showing the procedure of forming the solid-state imaging device shown in FIG. 1.

First of all, as shown in FIG. 2A, a high-concentration N-type epitaxial layer (a fifth impurity layer) 22 whose concentration is not lower than 5E15 cm$^{-3}$ is epitaxially grown to a film thickness of about 1 µm on an N-type substrate 21 whose concentration is about 1E15 cm$^{-3}$. Continuously, an intermediate-concentration N-type epitaxial layer (a fourth impurity layer) 23 whose concentration is about 1E15 cm$^{-3}$ is epitaxially grown to a film thickness of about 5 µm. The two N-type epitaxial layers 22 and 23 are grown in one growth process by varying the gas flow rate in the course of the epitaxial growth.

In this case, the high-concentration N-type epitaxial layer 22 whose concentration is not lower than 5E15 $cm^{-3}$ has a shuttering operation for sweeping the electric charges accumulated in a photodiode i.e. photosensitive section toward the substrate, i.e., the effect of reducing the depletion voltage necessary for depleting a light-receiving P-layer 33 described later. In order to prevent the depletion layer from expanding toward the N-type substrate 21, the above-mentioned concentration is needed.

Figure 2B:
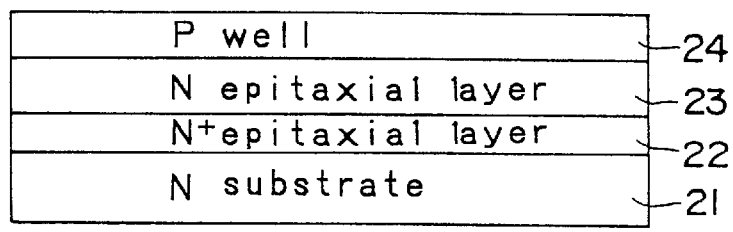

Next, as shown in FIG. 2B, a first P-type layer (a third impurity layer) 24 is formed by ion implantation. This first P-type layer 24 is formed only in an imaging region E as is apparent from the top view of the whole solid-state imaging device and the cross section (cross section indicated by arrow D–D' in FIG. 3) respectively shown in FIG. 3 and FIG. 4. Therefore, a photoresist (not shown) is formed on the intermediate-concentration N-type epitaxial layer 23a, and a window (not shown) is opened in a region of the photoresist to which the first P-type layer 24 corresponds, implanting boron ions therethrough. Then, the first p-type layer 24 is formed by removing the photoresist and thereafter performing heat treatment for activation. It is to be noted that an alignment target is formed by providing an Si stepped portion at the time of or before forming the first P-type layer 24 since it is required to align the photodiode and so on to be formed afterwards with this first P-type layer 24. Further, by adopting the aforementioned construction, a region in which the first P-type layer 24 is not formed partially exists as in an ineffective region F shown in FIG. 4. Therefore, the N-type substrate 21 can be electrically contacted with the substrate surface side via the region in which the first P-type layer 24 is not formed.

Figure 2C:
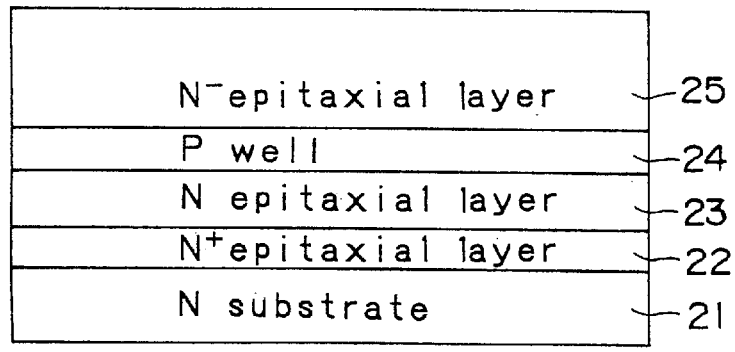

Next, as shown in FIG. 2C, a low-concentration N-type epitaxial layer (a second impurity layer) 25 whose concentration is not higher than 1E14 $cm^{-3}$ is epitaxially grown. In this stage, the low-concentration N-type epitaxial layer 25 contributes much to the sensitivity, and therefore, the sensitivity is dependent on the grown film thickness of this low-concentration N-type epitaxial layer 25. The film thickness should preferably be about 1 $\mu$m to 10 $\mu$m, and epitaxial growth was performed to a film thickness of 7 $\mu$m in the present embodiment. In the above case, the growth temperature should preferably be a low temperature so that the first P-type layer 24 would not expand through heat treatment. However, the shape of the Si stepped portion formed as the alignment target disadvantageously collapses through the epitaxial growth at a low temperature under the normal pressure. Therefore, the processing is performed by reduced pressure epitaxial growth in performing the growth at a low temperature of about 1050° C. to 1150° C. Otherwise, the growth is performed at a high temperature of not lower than 1150° C. in performing epitaxial growth under the normal pressure so that the shape of the Si stepped portion would not collapse.

Figure 2D:
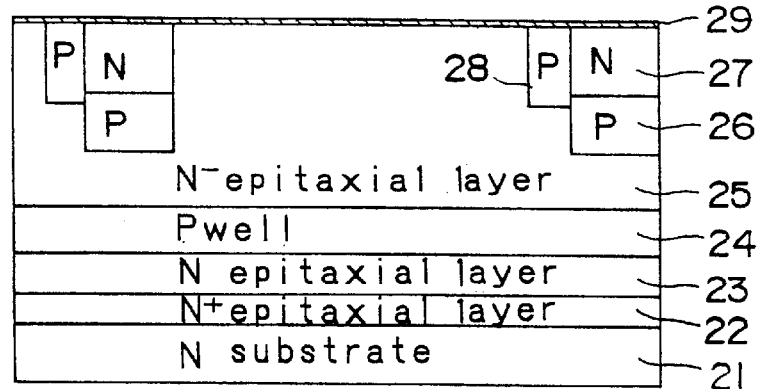

Next, as shown in FIG. 2D, a window (not shown) is opened in a photoresist (not shown) formed on the low-concentration N-type epitaxial layer 25. The window corresponds to a region in which a second P-type layer 26 and a transfer channel layer 27 are to be formed. Then, boron and phosphorus ions are successively implanted to form the second P-type layer 26 and the transfer channel layer 27 through the window. Next, after removing the above-mentioned photoresist, a window is opened in a photoresist, corresponding to a region in which a P-type channel stop layer 28 is to be formed, and boron ions are implanted through the window to form the channel stop layer 28. Individual pixels are thus separated.

Figure 2E:
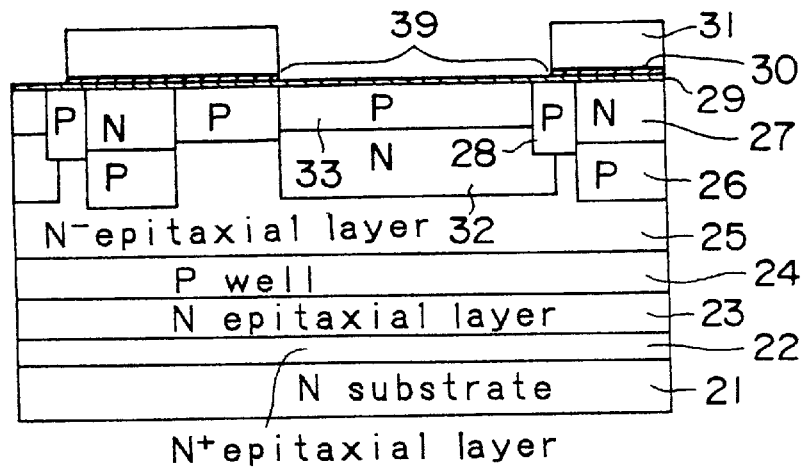

After the photoresist is removed, a silicon oxide film 29 that serves as a gate insulator is formed to a film thickness of about 30 nm by heat treatment. Further, a silicon nitride film 30 is formed to a film thickness of about 30 nm by CVD (chemical vapor deposition method). After the above process, a polysilicon film (not shown) to make a polysilicon gate electrode 31 (shown in FIG. 2E) is deposited by CVD, and phosphorus doping therein is performed by a solid phase thermal diffusion method ($POCl_3$ method) using $POCl_3$ as a diffusion source to make a phosphorus doped polysilicon film. A region of the phosphorus doped polysilicon film in which the polysilicon gate electrode 31 is to be formed is covered with a photoresist, and parts of the phosphorus doped polysilicon film and a silicon nitride film 30 are removed by reactive ion etching, forming the polysilicon gate electrode 31 as shown in FIG. 2E.

Next, a window (not shown) is opened in a region of a photoresist (not shown) formed on the low-concentration N-type epitaxial layer 25, corresponding to a light-receiving region 39, and phosphorus and boron ions are successively implanted in the low-concentration N-type epitaxial layer 25 through the window. Thus, a light-receiving N-layer (N-type impurity layer i.e. a first impurity layer) 32 and a light-receiving P-layer (P-type hole storage layer) 33 constituting the aforementioned photodiode i.e. photosensitive section are formed. Subsequently, the photoresist is removed.

Next, as shown in FIG. 1, a silicon oxide film that serves as an interlayer oxide film 34 is formed by CVD in order to provide insulation between the polysilicon gate electrode 31 and a light-shielding film 35 to be subsequently formed. A high-melting-point metal of tungsten or the like is deposited as the light-shielding film 35 by sputtering or CVD. Subsequently, a photoresist is formed on the light-shielding film 35, and a window is opened therein, corresponding to the light-receiving region 39, and the high-melting-point metal on the light-receiving region 39 is removed by reactive ion etching to form an opening 36.

Next, a BPSG (boro-phospho silicate glass) film 37 is deposited by CVD for a flattening purpose. Finally, a P–SiN film is deposited as a passivation film 38 by plasma CVD and subjected to a sintering process to obtain the solid-state imaging device of the present embodiment as shown in FIG. 1.

Figure 3:
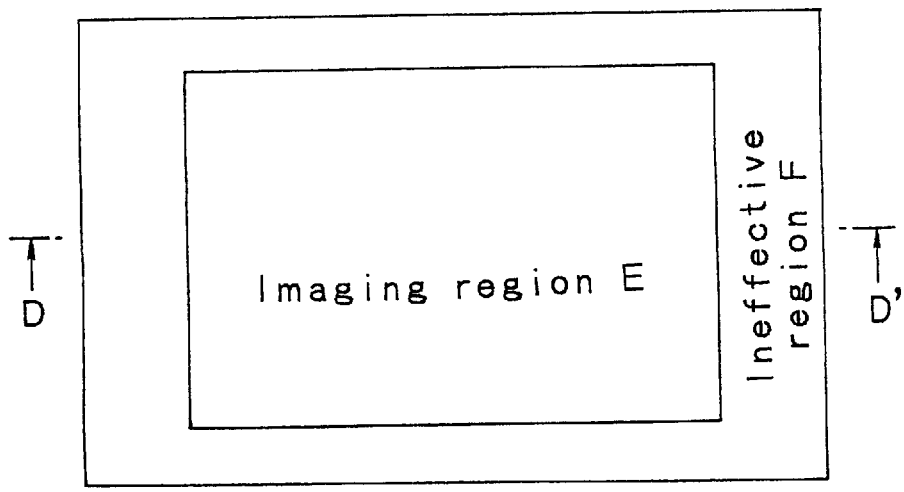
FIG. 3 is a top view of the whole body of the solid-state imaging device shown in FIG. 1.
Figure 4:
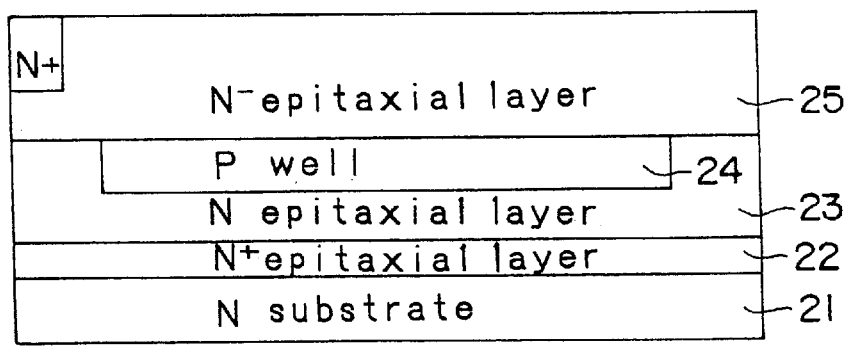
FIG. 4 is a sectional view indicated by arrow D–D' in FIG. 3.

As described above, in the present embodiment, the first P-type layer 24, which is the barrier region between the light-receiving N-layer 32 of the photodiode and the N-type substrate 21, is formed deeply apart from the substrate surface through ion implantation only in the imaging region E (see FIG. 3). With this arrangement, the N-type substrate 21 can be electrically connected to the substrate surface side via the ineffective region F (see FIG. 3) in which the first P-type layer 24 is not formed.

Further, the low-concentration N-type epitaxial layer 25 whose concentration is not higher than 1E14 $cm^{-3}$ is epitaxially grown on the first P-type layer 24 that serves as the barrier region. Then, a window is opened in a region of a photoresist (not shown) formed on the low-concentration N-type epitaxial layer 25, corresponding to the light-receiving region 39, and phosphorus ions are implanted in the low-concentration N-type epitaxial layer 25 to form the light-receiving N-layer (N-type impurity layer) 32. Thus, as indicated by the concentration profile of FIG. 5 along the cross section C–C' in FIG. 1, the high-concentration N-type region 32 is formed by ion implantation into a region G near the substrate surface, and a low-concentration N-type region 25 is formed by epitaxial growth in a deeper region H. By this arrangement, the depletion layer, which is formed between the light-receiving P-layer 33 and the light-receiving N-layer 32 constituting the photodiode, can be expanded to the deep portion of the substrate by the low-concentration N-type region H. As a result, the photoelectric conversion effect on the incident light of a long wavelength is increased to allow the sensitivity to be improved. In the above case, it is preferred that the low-concentration N-type epitaxial layer 25 and the light-receiving N-layer 32 have impurity concentrations differing from each other by two or more orders of magnitude.

Figure 6:
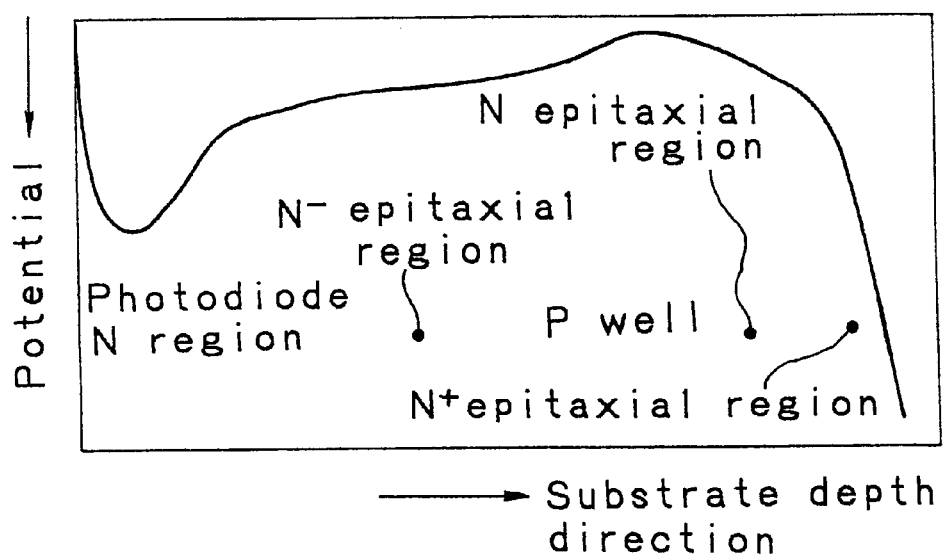
FIG. 6 is a graph showing a potential profile along the cross section C–C' in FIG. 1.
Figure 7:
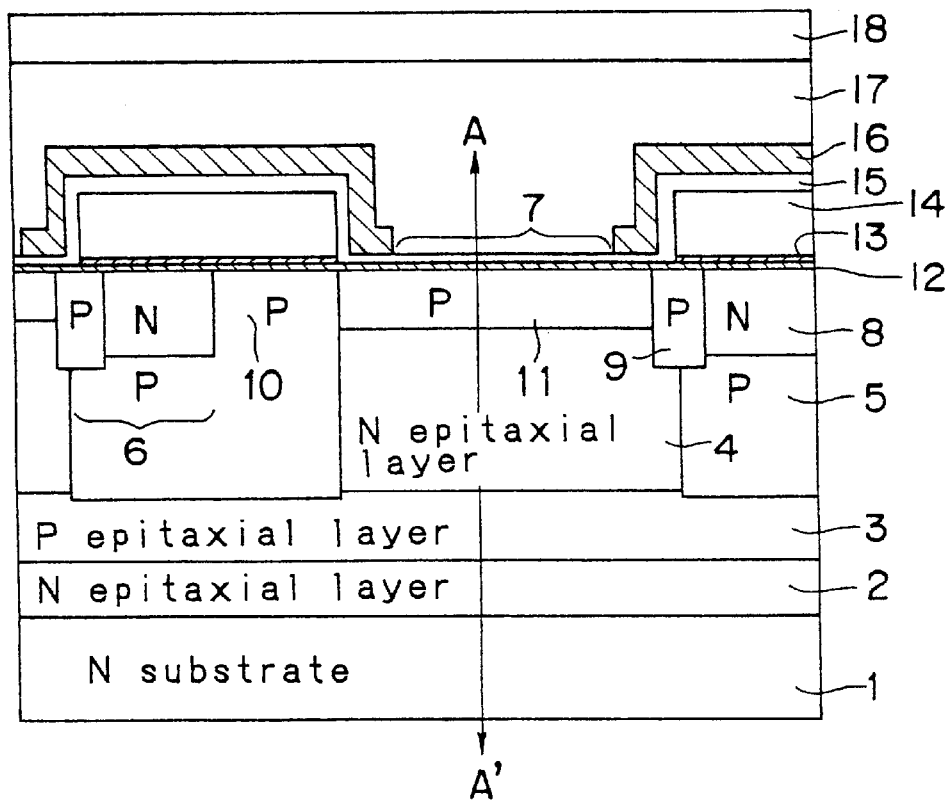
FIG. 7 is a sectional view of a conventional solid-state imaging device.
Figure 8:
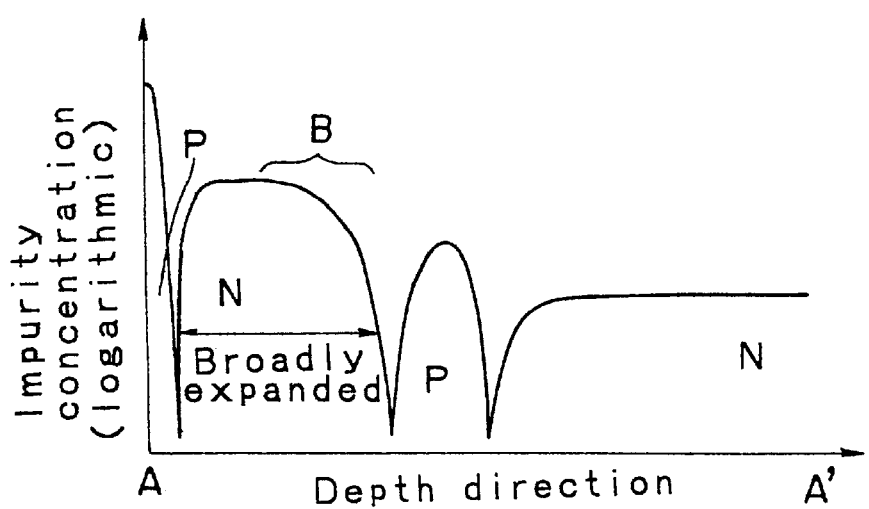
FIG. 8 is a graph showing a concentration profile along a cross section A–A' in FIG. 7.
Figure 9:
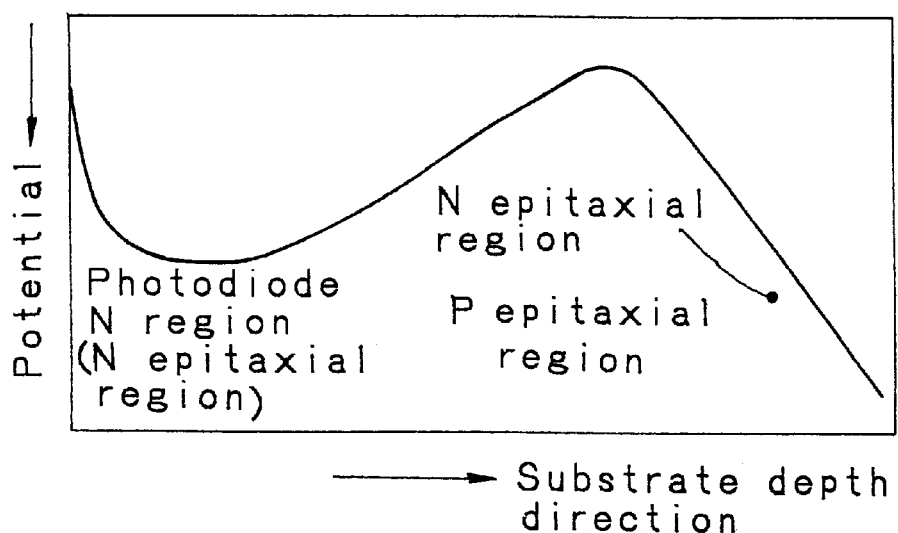
FIG. 9 is a graph showing a potential profile along the cross section A–A' in FIG. 7.

In the above case, as indicated by the potential profile of FIG. 6 along the cross section C–C' in FIG. 1, the deepest potential portion of a recess in the potential profile can be formed on the substrate surface side. Therefore, the voltage (depletion voltage) for completely reading the electric charges accumulated in the photodiode can be prevented from rising as compared with the case shown in FIG. 9 where the deep potential portion is broadly expanded to the deep portion of the substrate.

That is, according to the present embodiment, the sensitivity can be improved without causing a rise in the depletion voltage.

Furthermore, the high-concentration N-type epitaxial layer 22 whose concentration is not lower than 5E15 cm$^{-3}$ is epitaxially grown on the N-type substrate 21. Further, the intermediate-concentration N-type epitaxial layer 23 whose concentration is about 1E15 cm$^{-3}$ is epitaxially grown continuously. Then, the first P-type layer 24 is formed by ion implantation on the intermediate-concentration N-type epitaxial layer 23. Thus, by forming the first P-type layer 24 that is the barrier region and the light-receiving N-layer 32 by ion implantation, the impurity concentrations of both the layers 24 and 32 can easily be controlled to have a reduced variation. Therefore, the variations in quantity of the electric charges accumulated in the light-receiving region 39, the depletion voltage that is the voltage for completely reading out the electric charges accumulated in the light-receiving region 39, and the shutter voltage that is the voltage for completely sweeping the electric charges accumulated in the light-receiving region 39 can be reduced.

Figure 5:
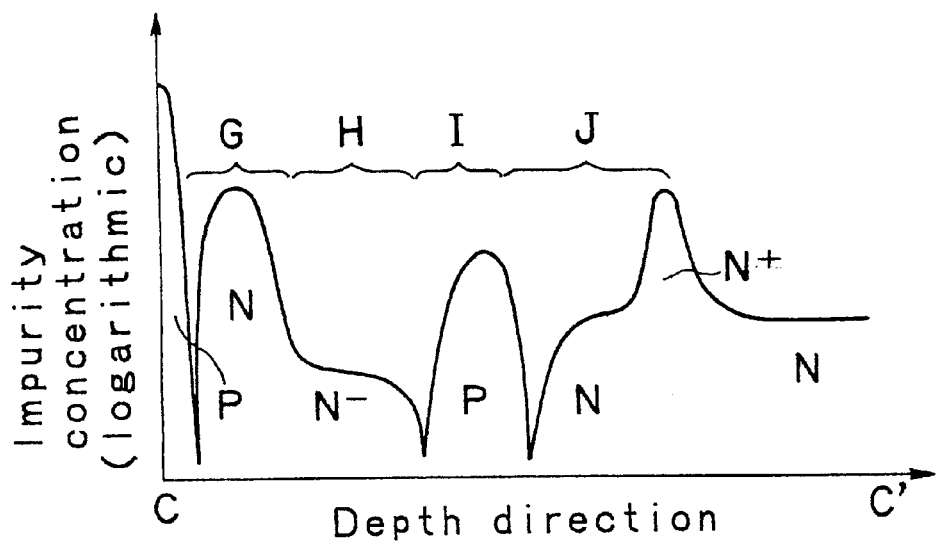
FIG. 5 is a graph showing a concentration profile along a cross section C–C' in FIG. 1.

As shown in FIG. 5, by forming by epitaxial growth the intermediate-concentration N-type region 23 and the high-concentration N-type region 22 whose concentration is not lower than 5E15 cm$^{-3}$ in a stack of two layers in a region J deeper than the region I in which the P-type layer 24 is formed, the shutter voltage can be prevented from rising.

Furthermore, the high-concentration N-type epitaxial layer 22 and the intermediate-concentration N-type epitaxial layer 23 on the N-type substrate 21 are grown in one growth process by varying the gas flow rate in the course of the epitaxial growth. Therefore, the films of two layers can be formed in one film forming process, and this allows the fabricating processes to be reduced.

The low-concentration N-type epitaxial layer 25 on the first P-type layer 24 is formed by being epitaxially grown at the low temperature of about 1050° C. to 1150° C. under the reduced pressure or epitaxially grown at the high temperature of not lower than 1150° C. under the normal pressure. Therefore, the shape of the Si stepped portion that serves as the alignment target provided for the first P-type layer 24 can be maintained so as not to collapse.

Although the first P-type layer 24 is formed only in the imaging region E in the aforementioned embodiment, it is possible to make contact with the N-type substrate 21 from the substrate surface via another portion even if the first p-type layer 24 is formed in a part of the ineffective region F.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A solid-state imaging device comprising:

a first impurity layer forming part of a photodiode;

a second impurity layer being of a conductive type identical to that of the first impurity layer and having an impurity concentration lower than that of the first impurity layer;

a third impurity layer being of a conductive type different from that of the first impurity layer;

a fourth impurity layer being of a conductive type identical to that of the first impurity layer;

wherein the second impurity layer, the third impurity layer and the fourth impurity layer are formed such that:

the second impurity layer is formed so as to be under and extending outwardly beyond the first impurity layer, the third impurity layer is formed under a portion of the second impurity layer and not formed under another portion of the second impurity layer so as to exclude at least a part of a non-imaging region, and the fourth impurity layer is formed so a portion thereof is under the third impurity layer and so another portion thereof is under the said another portion of the second impurity layer; and a fifth impurity layer being formed under the fourth impurity layer, being of a conductive type identical to that of the fourth impurity layer and having an impurity concentration higher than that of the fourth impurity layer.

2. A solid-state imaging device as claimed in claim 1, wherein the fourth impurity layer and the fifth impurity layer are continuously formed by varying a gas flow rate in one epitaxial growth process.

3. A solid-state imaging device as claimed in claim 1, wherein the fifth impurity layer has an impurity concentration of not lower than $5 \times 10^{15}$ cm$^{-3}$.

4. A solid-state imaging device as claimed in claim 1, wherein the second impurity layer is formed by low pressure epitaxial growth whose growth temperature is higher than 1050° C. and lower than 1150° C.

5. A solid-state imaging device as claimed in claim 1, wherein the second impurity layer is formed by atmospheric pressure epitaxial growth whose growth temperature is not lower than 1150° C.

6. A solid-state imaging device as claimed in claim 1, wherein the second impurity layer has an impurity concentration of not higher than $1 \times 10^{14}$ cm$^{-3}$.

7. A solid-state imaging device as claimed in claim 1, wherein the first impurity layer and the second impurity layer have impurity concentrations differing from each other by two or more orders of magnitude, and the impurity concentration of the first impurity layer is set higher than the impurity concentration of the second impurity layer.

* * * * *